United States Patent
Nakasuji

(12) 
(10) Patent No.: US 6,235,450 B1
(45) Date of Patent: May 22, 2001

(54) PATTERN FORMATION METHODS COMBINING LIGHT LITHOGRAPHY AND ELECTRON-BEAM LITHOGRAPHY AND MANUFACTURING METHODS USING THE SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/327,402

(22) Filed: Jun. 7, 1999

(30) Foreign Application Priority Data

Jun. 5, 1998 (JP) .................................................. 10-172097

(51) Int. Cl.⁷ ...................................................... G03C 5/00
(52) U.S. Cl. ........................ 430/296; 430/312; 430/328; 430/942
(58) Field of Search .................................. 430/296, 942, 430/312, 328

(56) References Cited

U.S. PATENT DOCUMENTS 5,958,626   9/1999   Nakasuji .................................. 430/5
6,020,107 * 2/2000   Niiyama et al. ...................... 430/296

FOREIGN PATENT DOCUMENTS 9-314595   10/1997  (JP) .
9-347319   12/1997  (JP) .

OTHER PUBLICATIONS

Matsuda et al., "Electron Beam/Optical Intralevel Mix–and–Match Lithography for Deep Submicron Device Fabrication," *J. Vac. Sci. Technol.* 8:1914–1918 (1990).

\* cited by examiner

*Primary Examiner*—Christopher G. Young
(74) *Attorney, Agent, or Firm*—Klarquist Sparkman Campbell Leigh & Whinston LLP

(57) ABSTRACT

A light exposure and an electron-beam exposure are used to expose respective portions of the same resist layer. The respective portions may overlap to form a double exposure region in which the resist is exposed by both light radiation and electron-beam radiation. The dosage of the light exposure and of the electron-beam exposure in the double exposure region may desirably be a gradually sloped dosage. The sum of the light exposure dosage and the electron-beam exposure dosage in the double exposure region is chosen to be at least equal to or, desirably, somewhat larger than the dosage in the non-overlapping portions of the light exposure region and the electron-beam exposure region. Alternatively, a light exposure and an electron-beam exposure are used to expose the same resist layer, with a narrow electron-beam exposure region extending into or cutting into a wider light exposure region, with no overlapping or small overlapping at the end of the narrow electron-beam exposure region.

10 Claims, 4 Drawing Sheets

(B)

PATTERN FORMATION METHODS COMBINING LIGHT LITHOGRAPHY AND ELECTRON-BEAM LITHOGRAPHY AND MANUFACTURING METHODS USING THE SAME

FIELD

The present invention is related to lithography methods that combine electron-beam exposure for high resolution and light exposure for high throughput. More particularly, the present invention relates to improved pattern-formation methods that allow the formation of reliable connections or junctions between a light-exposed portion and an electron-beam exposed portion of an individual resist layer.

BACKGROUND

Electron-beam lithography has been used to form a contact hole layer of a semiconductor device in which other layers are formed by light lithography. It has also been proposed (e.g., in IEEE ELECTRON DEVICE LETTERS, VOL. EDL-2, NO. 11, NOVEMBER 1981) to use light exposure and electron-beam exposure to expose respective portions of the same resist layer in the fabrication of a semiconductor device.

Using electron-beam lithography and light lithography for separate layers of a semiconductor device presents no particular difficulties. Problems can arise, however, when a light exposure and an electron-beam exposure are used within a single resist layer to form respective portions of a pattern in that layer. In particular, where a connection is required between a pattern element to be defined by light exposure and pattern element to be defined by electron-beam exposure, breaks in the pattern can occur at the connection region.

The present invention allows the use of both the high resolution of electron-beam exposure and the high throughput of light exposure in the same resist layer, while providing pattern-formation methods that minimize the occurrence of pattern breaks.

SUMMARY

The problem addressed by the present invention may arise as illustrated in FIG. 3. FIG. 3(A) is a top view of a pattern having an electron-beam exposure region and a light exposure region. FIG. 3(B) is a graph showing the typical dosage distribution of the electron-beam exposure region and the light exposure region.

In FIG. 3(A), a narrow line width (for example, 0.1 μm) electron-beam exposure pattern 81 and a wide line width (for example, 1.0 μm) light exposure pattern 83 are shown. The patterns 81, 83 abut each other at a connection region 85.

FIG. 3(B) shows a dosage distribution along a line B—B (shown in FIG. 3(A)) passing through both patterns 81, 83. The electron-beam dosage distribution 91 is shown on the left side of the figure, and the light dosage distribution 93 is shown on the right side of the figure. The relative scale of the dosages as shown corresponds to the sensitivity of the resist relative to each respective radiation type.

Broken line 95 represents the total dosage, i.e., the sum of the light dosage and the electron-beam dosage, in the vicinity of the connection region 85. As shown in the figure, the total dosage 95 is not flat in the vicinity of the connection region 85, but exhibits considerable variation including a valley 95a and a peak 95b. This variation depends on the characteristics of the curves at the edges of the respective dosage distributions. In the example shown in the figure, an edge curve 91a of the electron-beam dosage distribution 91 falls comparatively fast. In contrast, an edge curve 93a of the light dosage distribution 93 has a comparatively gentle slope. The dosage of an end portion 93b of the light dosage distribution edge curve is thus added to 100% of the dosage of the electron-beam dosage distribution 91, resulting in a total dosage represented by the peak 95b. In contrast, an end portion 91b of the electron-beam dosage distribution 91 does not completely offset a portion 93c of the more sharply-sloped light dosage distribution 93, resulting in a total dosage represented by the valley 95a.

The significant variation of the total dosage shown in FIG. 3(B), particularly the valley 95a, can tend to cause a break in the exposed and developed pattern, with a resulting break or short in the semiconductor structures to be formed. With a total dosage having a valley such as valley 95a at or near the connection portion 85, pattern breaks can occur, even if the relative positioning of both patterns 81 and 83 is perfectly accurate. In practice, some degree of relative positioning error between an electron-beam exposure pattern and a light exposure pattern typically occurs, thereby increasing the danger of pattern breaks in the exposed and developed pattern.

According to one example embodiment of the present invention, a light exposure and an electron-beam exposure are used to expose respective portions of the same resist layer. The respective portions overlap to form a double-exposure region in which the resist is exposed by both light radiation and electron-beam radiation. The dosage of the light exposure and of the electron-beam exposure in the double-exposure region is desirably a gradually sloped dosage. The sum of the light exposure dosage and the electron-beam exposure dosage in the double-exposure region is chosen to be at least equal to or, desirably, somewhat larger than the dosage in the non-overlapping portions of the light exposure region and the electron-beam exposure region. This method of "gray splicing" prevents valleys in the total dosage distribution and facilitates smooth linking of the two differing exposure regions.

According to another example embodiment of the present invention, a light exposure and an electron-beam exposure are used to expose the same resist layer, with a narrow electron-beam exposure region extending into a wider light exposure region, with or without overlapping between the regions. By extending the electron-beam exposure region into the light exposure region, the continuity of the resulting circuit can be sufficiently ensured.

Other advantages and features of the invention will be apparent from the detailed description below.

DETAILED DESCRIPTION

Figure 1A:
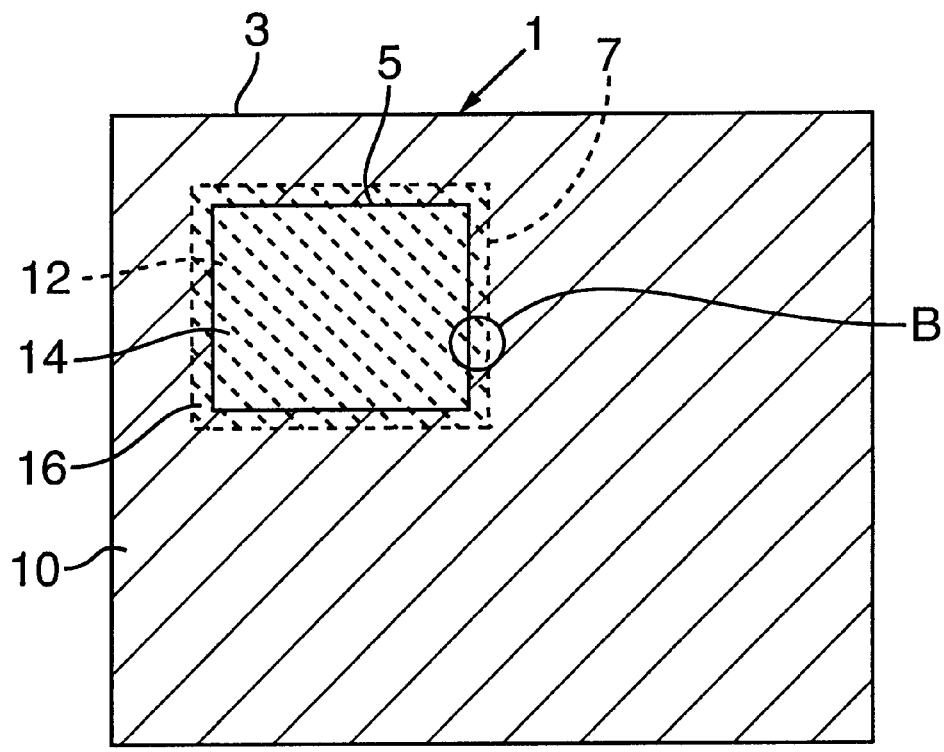
FIG. 1(A) is a schematic plan view of a semiconductor device in fabrication showing high-and low-density regions and electron-beam and light exposure regions.
Figure 1B:
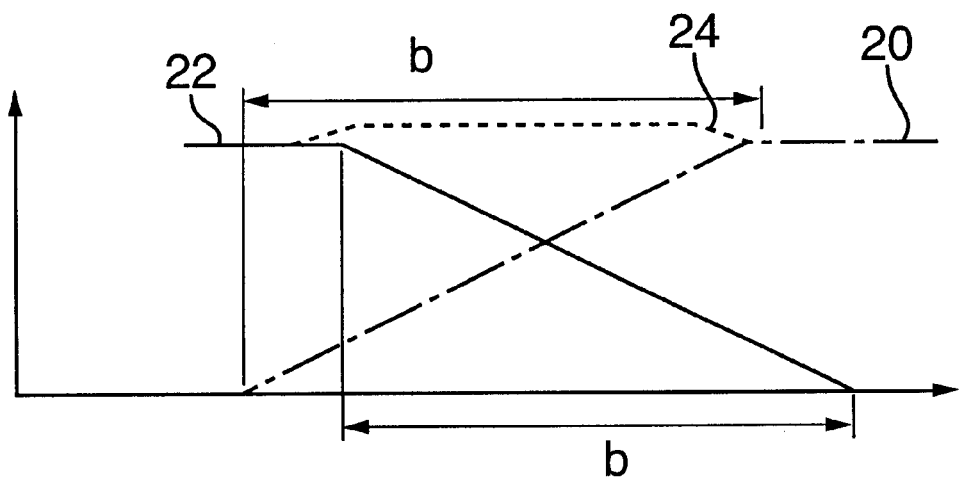
FIG. 1(B) is graph of the exposure dosage distribution across the area B of FIG. 1(A).

FIG. 1 illustrates a pattern-formation method according to an example embodiment of the present invention. FIG. 1(A) is a schematic plan view of a semiconductor device in fabrication showing the orientation of a light exposure region and an electron-beam exposure region. FIG. 1(B) is a graph showing a magnified dosage distribution of the area B of FIG. 1(A).

In FIG. 1(A), a typical microprocessor layer 1 is shown. At the upper left is a high-density portion 14 (within the solid line 5), with features having a narrow (for example, 0.1 μm) line width. The area outside the solid line 5 is a low-density portion with features having a comparatively wide (for example, 0.2 μm) line width.

An electron-beam exposure region 12 (indicated by the broken cross-hatching within the broken line 7) includes and extends beyond the high-density portion 14. A light exposure region 10 (indicated by the large unbroken cross-hatching bounded by the solid line 3 and the solid line 5) surrounds the high-density portion 14. The electron-beam exposure region may be exposed first, followed by exposure of the light exposure region. The overlap between the electron-beam exposure region 12 and the light exposure region 10 forms a double-exposure region 16. The width of the double exposure region 16 is, for example, approximately 2 μm.

The dosage distribution across the double-exposure region 16 at area B of FIG. 1(A) is shown in FIG. 1(B). The relative dosages shown in FIG. 1(B) are scaled corresponding to the sensitivity of the resist to each respective radiation type. The electron-beam dosage distribution is indicated by the solid line 22, the light dosage distribution by the dot-dash line 20, and the total dosage by the broken line 24. In this example embodiment, both the electron-beam dosage distribution 22 and the light dosage distribution 20 are purposefully contoured with extended sloped portions at their respective ends. The width of the sloped portions is, for example, 1 to 3 μm. In exposing the electron-beam exposure region, the deflection speed of the electron beam may be manipulated to achieve the desired sloped dosage distribution. In exposing the light exposure region, a mask with a non-uniform transparency may be used to achieve the desired sloped distribution.

The slope and overlap of the two exposure regions are chosen such that the total dosage 24 in the double-exposed area is 100% or more of the individual dosages in the non-double exposed areas, as shown in FIG. 1(B). This tends to prevent pattern breaks and to make the dosage profile in the connection region smooth.

FIG. 2 shows plan views of exposure patterns having both electron-beam and light exposure regions illustrating pattern-formation methods according to other embodiments of the present invention.

Figure 2A:
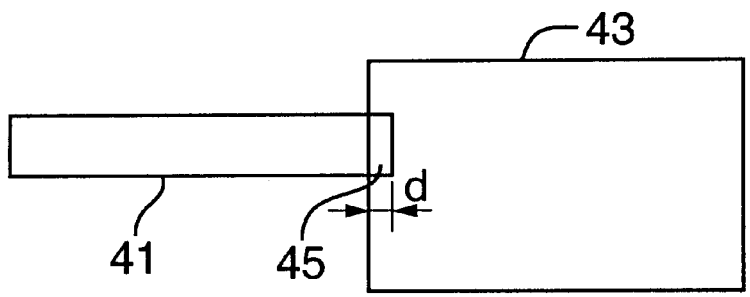
FIG. 2(A) is a diagram of example electron-beam and light exposure regions according to another embodiment of the invention.

In the example embodiment of FIG. 2(A), a double-exposure portion 45 is disposed in the overlap between a narrow electron-beam exposure pattern 41 and a wide light exposure pattern 43. A width d of the double-exposure portion 45 is approximately 0.05 to 0.1 μm. The double-exposure portion generally prevents the occurrence of pattern breaks.

Figure 2B:
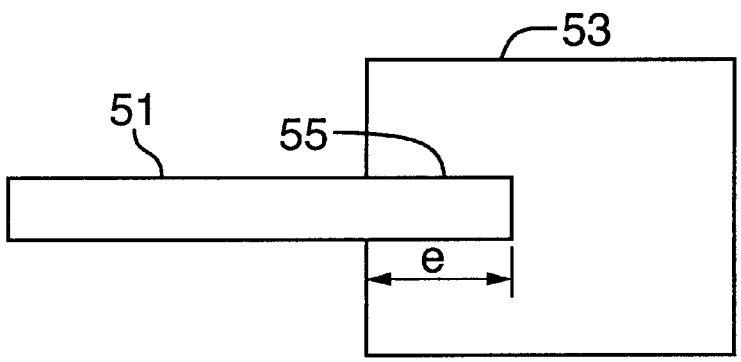
FIG. 2(B) is a diagram of example electron-beam and light exposure regions according to yet another embodiment of the invention.

In the example embodiment of FIG. 2(B), a right end portion 55 of an electron-beam exposure pattern 51 cuts into (i.e., extends into without overlapping) a light exposure pattern 53 by a length e. In other words, electron-beam exposure pattern 51 extends a length e into a concavity in the light exposure pattern 53. The length e may be, for example, 0.5 to 1 μm. This configuration increases the effective length of the abutting connection region between the electron-beam exposure pattern 51 and the light exposure pattern 53, sufficiently ensuring the continuity between electron-beam exposure pattern 51 and light exposure pattern 53.

Figure 2C:
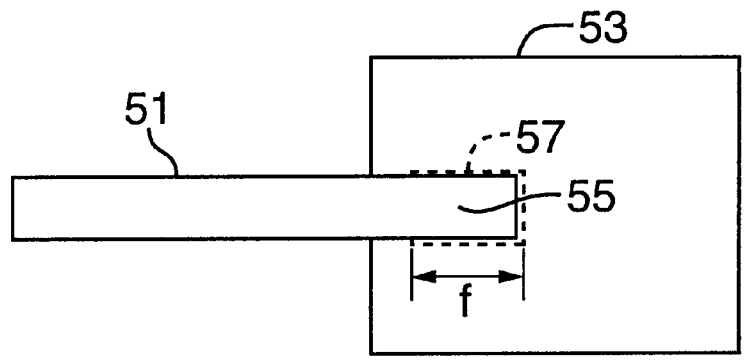
FIG. 2(C) is a diagram of example electron-beam and light exposure regions according to still another embodiment of the invention.
Figure 3A:
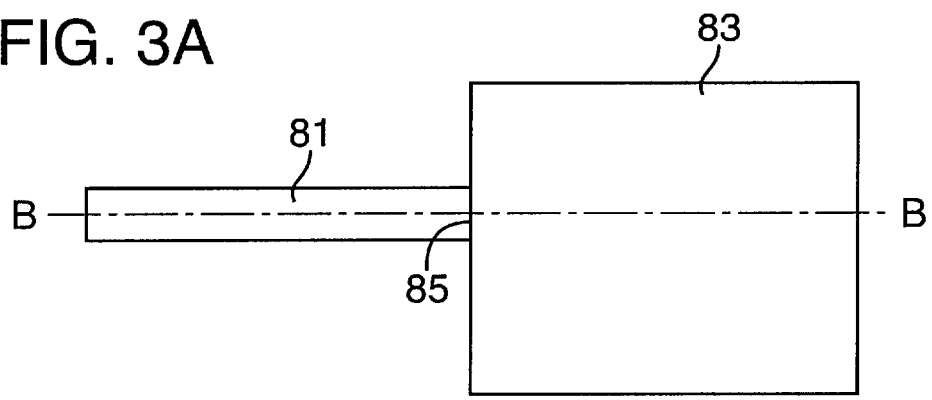
FIG. 3(A) is a diagram of edge-abutting electron-beam and light exposure regions.
Figure 3B:
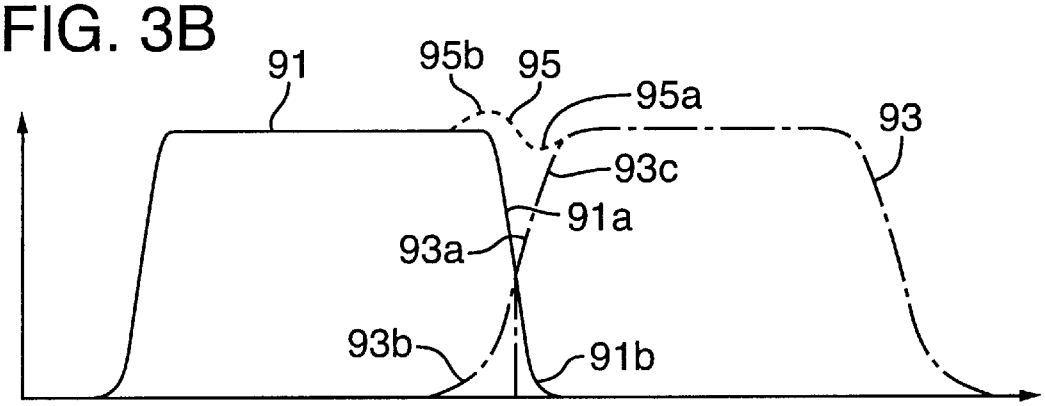
FIG. 3(B) is a graph of the exposure dosage distribution along the line B—B of FIG. 3(A).

In the example embodiment of FIG. 2(C), a right end portion 55 of an electron-beam exposure pattern 51 cuts into and, at the rightmost end thereof, slightly overlaps, a light exposure pattern 53. This configuration results in a narrow double-exposure portion 57. Double-exposure portion 57 is so positioned, and has a width f (e.g., 0.02 to 0.05 μm) sufficiently small, to ensure that the concave corners of the total exposure pattern located at the connection of light exposure pattern 53 and the electron-beam exposure pattern 51 are adequately sharp, i.e., that the corner radius is sufficiently small.

Figure 4:
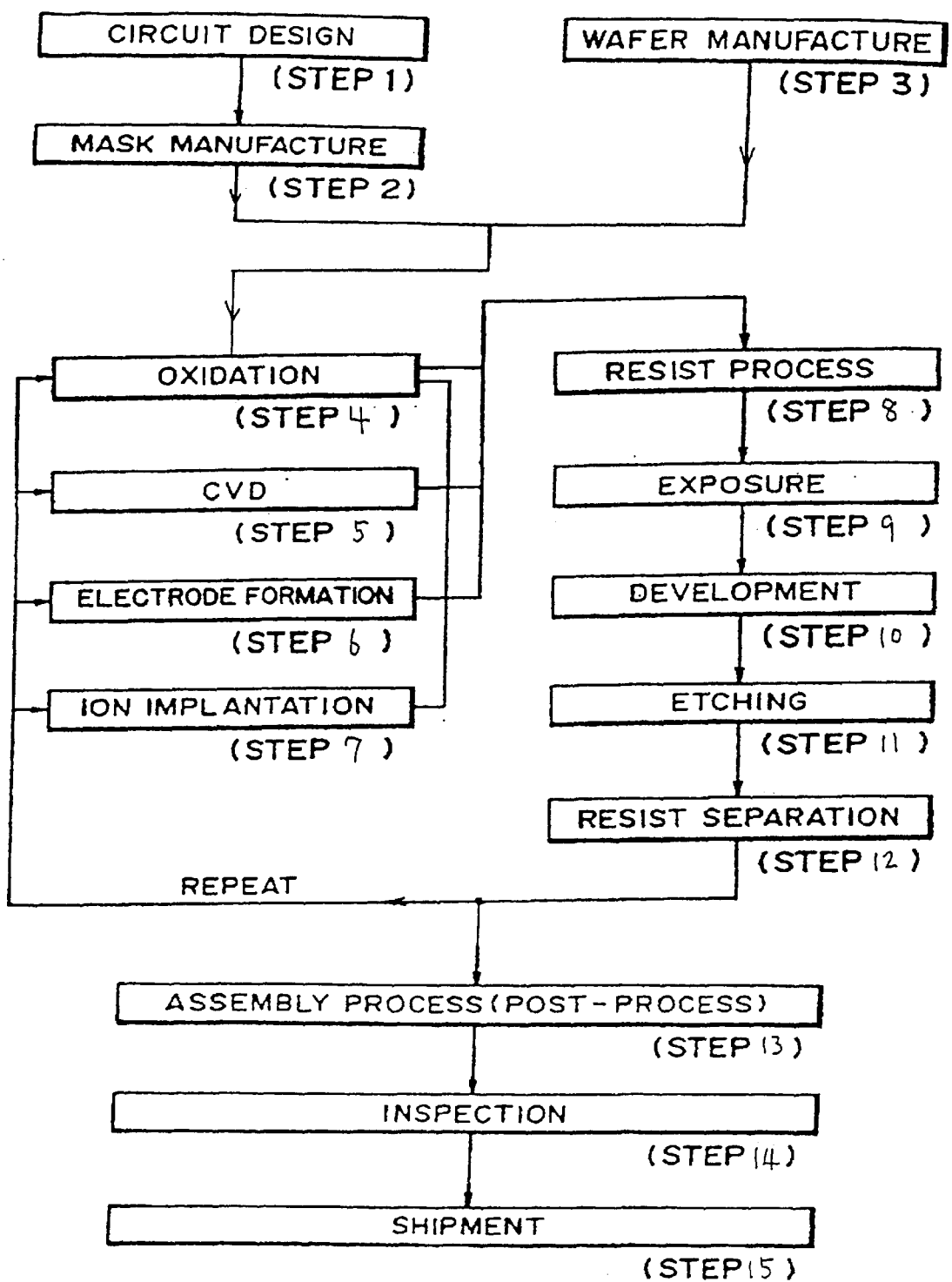
FIG. 4 is a flow chart of a process sequence for manufacturing a semiconductor device.

FIG. 4 is a flow chart of an example process sequence for manufacturing a semiconductor device such as a semiconductor chip, a liquid crystal panel, or a CCD, for example, utilizing the pattern-formation methods discussed above. Step 1 is a design process for designing the circuit(s) of a semiconductor device. Step 2 is a process for manufacturing a mask (or masks) on the basis of the circuit patterns designed in step 1. Step 3 is a process for manufacturing a semiconductor wafer by using a material such as silicon.

Steps 4–12 are wafer processing steps (known as pre-process) wherein, circuits are formed on the wafer from step 3 by lithography using the mask(s) of step 2. The pre-process steps are repeated as needed to form the various layers of the semiconductor device. Step 13 is an assembly step (known as post-process) wherein the wafer is separated into dies that are packaged to form semiconductor chips. This step includes assembling (dicing and bonding) and packaging (chip sealing). Step 14 is an inspection step in which various tests may be performed on the semiconductor devices from step 13, including tests for operability, durability, and so forth. The tested devices are then shipped (step 15).

Steps 4–12 include example details of wafer processing. Step 4 is an oxidation process for oxidizing the surface of a wafer. Step 5 is a CVD process for forming an insulating film on the wafer surface. Step 6 is an electro-deforming process for forming electrodes on the wafer by vapor deposition. Step 7 is an ion implanting process for implanting-ions into the wafer. Step 8 is a resist process for applying a resist (a photosensitive material) to the wafer. Step 9 is an exposure process for exposing the resist to an exposure pattern according to the methods described above. Step 10 is a developing process for developing the exposed resist. Step 11 is an etching process for removing portions of material from the wafer other than the developed resist image. Step 12 is a resist separation process for separating the resist material remaining on the wafer after being subjected to the etching process. By repeating these processes, circuit patterns are formed in successive superimposed layers on the wafer.

As may be seen from the above description, according to the present invention, it is possible to provide pattern-formation methods that utilize the high resolution of an electron-beam exposure and the high throughput of a light exposure in the same resist layer, while reducing or preventing the incidence of pattern breaks between differing exposure regions.

The invention is described herein with reference to particular embodiments, but variations within the spirit and scope of the invention will occur to those skilled in the art. Accordingly, the scope of the invention is as defined in the appended claims.

I claim:

1. A method for forming patterns in a radiation-sensitive layer, comprising exposing a light exposure pattern on the sensitive layer using light, and exposing an electron-beam exposure pattern on the sensitive layer using an electron beam, wherein the light exposure pattern and the electron-beam exposure pattern overlap in a double-exposure region connecting the light-exposure pattern and the electron-beam exposure pattern, and the electron-bean exposure pattern is exposed in a manner such that the double-exposure region acquires a sloping dosage profile of electron-beam exposure.

2. The method of claim 1, wherein the step of exposing an electron-beam exposure pattern comprises scanning the electron-beam exposure pattern at varying scan rates so as to produce the sloping profile of electron-beam exposure.

3. The method of claim 1, wherein the step of exposing a light exposure pattern comprises exposing the light exposure pattern in a way such that a sloping dosage profile of light exposure results in the double-exposure region.

4. The method of claim 3, wherein the step of exposing a light exposure pattern comprises exposing the light exposure pattern using a mask with a non-uniform transparency.

5. The method of claim 3, wherein a total dosage resulting from the sum of the light exposure dosage and of the electron-beam exposure dosage in the double-exposure region is greater than a total dosage of either light or electron-beam radiation outside the double-exposure region.

6. A method of claim 5, wherein a total dosage resulting from the sum of the light exposure dosage and of the electron-beam exposure dosage in the double-exposure region is greater than a total dosage of either light or electron-beam radiation outside the double-exposure region.

7. A method for forming patterns in a radiation-sensitive layer, comprising exposing a light exposure pattern on the sensitive layer using light, and exposing an electron-beam exposure pattern on the sensitive layer using an electron beam, the two pattern being connected at a connection region in which the electron-beam exposure pattern cuts into the light exposure pattern such that the electron-beam exposure pattern is abutted on three sides by the light exposure pattern.

8. A method for manufacturing a device by using both electron-beam and light lithography on a given resist layer, the method comprising:

(i) exposing a resist layer to a light exposure pattern; and (ii) exposing the resist layer to an electron-beam exposure pattern, wherein the light exposure pattern and the electron-beam exposure pattern overlap in a double-exposure region connecting the light exposure pattern and the electron-beam exposure pattern, wherein the electron-beam exposure pattern has a sloped dosage profile across the double-exposure region.

9. The method of claim 8, wherein the dosage profile of the light exposure region across the double-exposure region is sloped.

10. A method for manufacturing a device by using both electron-beam lithography and light lithography on a given resist layer, the method comprising:

(i) exposing a resist layer to a light exposure pattern; and (ii) exposing the resist layer to an electron-beam exposure pattern, wherein the electron-beam exposure pattern extends into a concavity in the light exposure pattern such that three sides of the electron-beam exposure pattern abut the light exposure pattern.

* * * * *

UNITED STATES PATENT AND TRADEMARK OFFICE
CERTIFICATE OF CORRECTION

PATENT NO.   : 6,235,450 B1
DATED        : May 22, 2001
INVENTOR(S)  : Mamoru Nakasuji It is certified that error appears in the above-identified patent and that said Letters Patent is hereby corrected as shown below:

<u>Column 3,</u>
Line 31, "double exposure" should be changed to -- double-exposure --.

<u>Column 5,</u>
Line 33, "region is greater" should be changed to -- region is equal to or greater --.

Signed and Sealed this

Eighteenth Day of March, 2003

JAMES E. ROGAN
*Director of the United States Patent and Trademark Office*